United States Patent [19]

Tainter, Jr. et al.

[11] Patent Number: 4,583,806
[45] Date of Patent: Apr. 22, 1986

[54] LOW INSERTION-FORCE SOCKET FOR IC DEVICE

[75] Inventors: Leland B. Tainter, Jr.; Edward J. Goeppinger; William H. King, all of Riverside; Ronald E. Smith, Sunnymead, all of Calif.

[73] Assignee: Bourns, Inc., Riverside, Calif.

[21] Appl. No.: 690,566

[22] Filed: Jan. 11, 1985

[51] Int. Cl.$^4$ ................................................ H01R 13/631
[52] U.S. Cl. ........................ 339/75 MP; 339/17 CF; 339/75 M; 339/252 R
[58] Field of Search .......... 339/17 CF, 75 M, 75 MP, 339/252 R

[56] References Cited

U.S. PATENT DOCUMENTS

| 3,297,974 | 1/1967 | Pittman | 339/17 CF |
|---|---|---|---|
| 3,409,861 | 11/1968 | Barnes et al. | 339/174 |
| 3,663,920 | 5/1972 | Lapham et al. | 339/17 CF |
| 3,719,917 | 3/1973 | Fischer et al. | 339/17 CF |
| 3,746,157 | 7/1973 | I'Anson | 206/46 |
| 3,907,394 | 9/1975 | Barnes | 339/65 |
| 3,993,381 | 11/1976 | Horbach | 339/17 |
| 4,026,412 | 5/1977 | Henson | 206/331 |
| 4,035,046 | 7/1977 | Kloth | 339/17 |
| 4,349,238 | 9/1982 | Showman et al. | 339/75 |
| 4,354,718 | 10/1982 | Bright et al. | 339/17 CF |
| 4,397,510 | 8/1983 | Asada et al. | 339/17 |
| 4,402,561 | 9/1983 | Grabbe et al. | 339/17 |
| 4,417,777 | 11/1983 | Bamford | 339/17 |
| 4,427,249 | 1/1984 | Bright et al. | 339/17 |
| 4,461,525 | 7/1984 | Griffin | 339/75 |
| 4,470,650 | 9/1984 | Lundergan | 339/75 MP |
| 4,527,850 | 7/1985 | Carter | 339/17 CF |

FOREIGN PATENT DOCUMENTS

| 39706 | 2/1932 | France | 339/252 R |
|---|---|---|---|
| 424507 | 2/1935 | United Kingdom | 339/252 R |

Primary Examiner—John McQuade
Attorney, Agent, or Firm—Howard J. Klein; William G. Becker

[57] ABSTRACT

A socket for an integrated circuit device, particularly of the "Small Outline" type, includes a receptacle having a base and a pair of opposing side walls. A row of spaced-apart, generally vertical guide members extending inwardly from the interior surface of each side wall defines a row of generally vertical slots adjacent the interior surface of each side wall. Near the bottom of each slot is an electrical contact, comprising a pair of elongate, overlapping wire loops, each having a leg interposed between the legs of the other loop. The contact has one end conductively connected to an interior portion of a conductive pin which extends through the base of the receptacle. The other end of the contact is a free end that exhibits a resilient flexibility. A cover is provided with two opposed rows of downwardly-extending fingers, each of which is registrable with, and receivable in, one of the slots. The slots are spaced and dimensioned so that each lead of the IC device is received in a separate slot when the device is placed in the receptacle. When the cover is then placed on the receptacle, each lead of the device is firmly engaged between a finger of the cover and the resilient electrical contact in the slot.

28 Claims, 6 Drawing Figures

U.S. Patent   Apr. 22, 1986   4,583,806
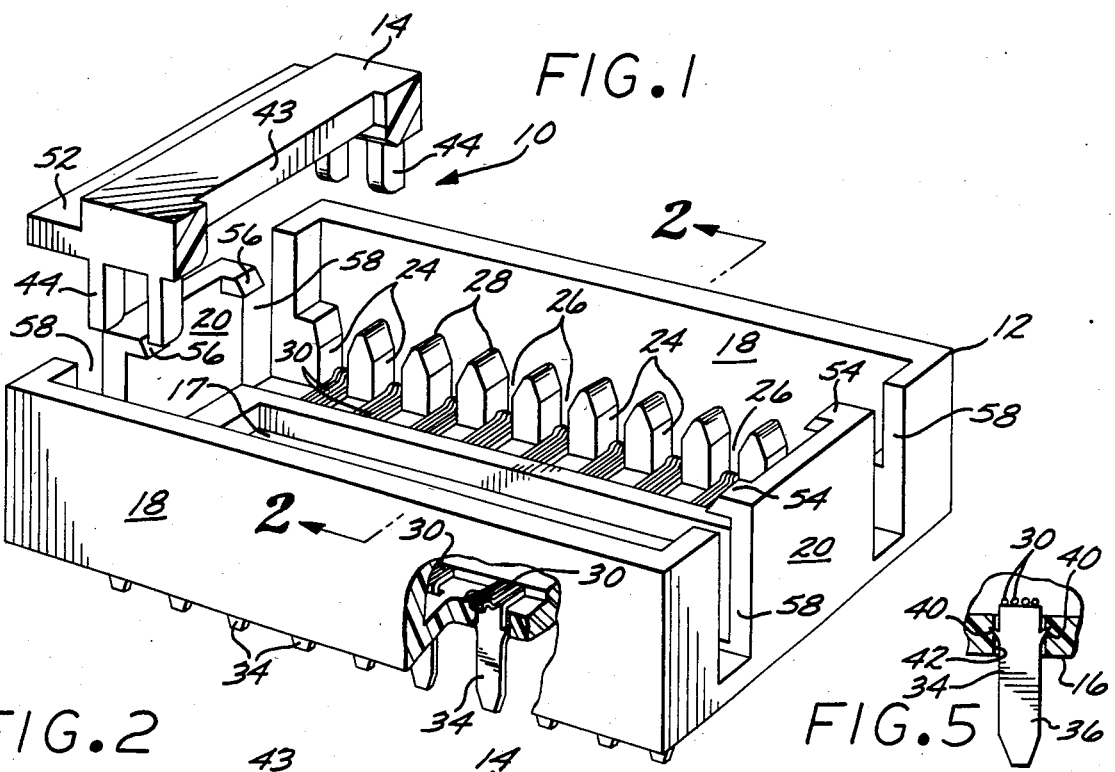

LOW INSERTION-FORCE SOCKET FOR IC DEVICE

BACKGROUND OF THE INVENTION

This invention relates generally to the field of sockets for electronic components and devices. More particularly, it relates to a socket for integrated circuit devices, especially those of the so-called "small outline" type, in which the device can be installed or "socketed" with little or no insertion force applied to the body of the device, and with subsequent retention forces applied substantially only to the leads of the device.

The use of integrated circuit ("IC") devices has become commonplace in the electronics field. One type of IC device which has recently gained popularity is the "small outline" or "SO" device. The SO device resembles the standard dual-in-line package ("DIP") device, but it is substantially smaller in size, with short, stubby pins with horizontal end tabs, as opposed to the long, thin, generally vertical pins of the standard DIP device.

In many applications, the IC device is "surface-mounted", that is, soldered or otherwise permanently fastened directly onto a circuit board. In some applications, however, a permanent installation is not desired, due to a need, for example, to remove the device periodically. This is true, for example, in testing and "burn-in" procedures. In such applications, a socket is necessary for the temporary installation of an IC device into a testing or burn-in circuit.

Small outline devices pose particular socketing problems because of their small size. For example, the pin configuration of the SO device is not suitable for standard DIP sockets, and maintaining good electrical contact between SO device pins and socket contacts is difficult. Compounding this problem is the relatively delicate nature of SO devices, which mandates the use of sockets that require relatively little force on the body of the device to insert the device into, and remove it from, the socket.

Accordingly, specialized sockets have been devised specifically for use with SO devices. An example is disclosed in U.S. Pat. No. 4,461,525 to Griffin. The Griffin device employs hinged "clamp wings" mounted on the sides of the socket. Each clamp wing includes conductive leads having terminal contacts which make contact with the SO device pins when the clamp wings are pivoted into their upright position. With this arrangement, the clamp wings provide electrical contact with the SO device pins, while also retaining the device within the socket.

The Griffin device has the desirable characteristic of low insertion force. Nevertheless, the need to combine the low insertion force feature with good physical retention, simplicity of design, and durability of electrical contact integrity has led to a search for further improvements in the design of SO device sockets.

SUMMARY OF THE INVENTION

Broadly, the present invention is an IC device socket, comprising a receptacle having a pair of side walls extending upwardly from a base, a row of spaced-apart vertical slots along the interior surface of at least one of the side walls, an electrical contact near the bottom of each slot, and a cover element or lid having a plurality of downwardly-extending fingers, each of which is registrable with, and receivable in, one of the slots. The receptacle is dimensioned to receive the IC device, and the slots are spaced and dimensioned so that each lead is individually received in a separate slot. The device is placed in the receptacle with the leads received in the slots, and when the cover element is placed on top of the receptacle, the fingers extend into the slots so that the leads of the IC device are each engaged between one of the fingers and one of the electrical contacts.

More specifically, the slots are formed by a row of substantially vertical guide members extending inwardly from the interior side wall surface and upwardly from the base at least part of the way up the side wall, with the slots being defined between adjacent guide members. The electrical contacts are, preferably, of the multi-wire type, and are each conductively attached to the interior portion of a socket pin extending through the base. In the preferred embodiment described in detail below, the receptacle and its associated slots are dimensioned and configured to accommodate a small outline (SO) device, and the cover element is configured with a recess in its interior surface conforming to the outline of the SO device body. Also, in the preferred embodiment, the socket pins are provided with barbs along their shank portions where they pass through the base, to restrain vertical movement of the pins through the base during handling and assembly, and to prevent the pins from being loosened.

The present invention offers a number of advantages over prior art sockets, especially when it is specifically configured as a socket for an SO device. The use of fingers on the cover element, in conjunction with contacts at or near the bottom of the slots in the receptacle, allows each lead of the device to be firmly and securely engaged between the finger and the contact, even if the leads of the device have non-coplanar terminations. This engagement assures secure device retention and positive electrical contact with low contact resistance. These qualities are enhanced by the use of multi-wire contacts, especially if the contacts are mounted on the socket pins in a cantilevered manner that provides them with a spring-like resilience which tends to push upwardly against the device leads. The use of the cover element to secure lead engagement with the contacts provides for low insertion force and easy removal of the device from the sockets. The entire socket assembly is relatively compact; in fact, it can be dimensioned only slightly larger than the device it is to receive. Also, the socket is of a design that is relatively simple and economical to manufacture, not requiring any moving parts (other than the removable cover, which may, if desired, be hinged to one end or side of the receptacle).

These and other advantages of the present invention will be best appreciated from the detailed description which follows.

BRIEF DESCRIPTION OF THE DRAWINGS

FIG. 1 is a perspective view of a preferred embodiment of the invention, with a portion of the receptacle and the cover element broken away;

FIG. 2 is a cross-sectional view along line 2—2 of FIG. 1, showing the socket when it is empty;

FIG. 3 is a cross-sectional view similar to that of FIG. 2, showing a typical small outline IC device installed in the socket;

FIG. 4 is a detailed view of that portion of FIG. 3 enclosed within the dashed-outline circle "4", showing the engagement of an IC device lead between a cover element finger and an electrical contact of the socket;

FIG. 5 is a detailed view of a socket pin, taken along line 5—5 of FIG. 2; and

FIG. 6 is a perspective view of an electrical contact assembly used in the present invention.

DETAILED DESCRIPTION OF THE INVENTION

Referring now to the drawings, an IC device socket assembly in accordance with a preferred embodiment of the invention is designated by the numeral 10. The socket assembly 10 comprises two major subassemblies: a receptacle 12 and a cover 14. The receptacle 12 comprises a generally rectangular base 16 (FIG. 2) having a central vent opening 17 for heat dissipation and drainage of condensation. From each of the longer sides of the base 16 extends a generally vertical side wall 18. Each of the shorter sides of the base 16 is advantageously provided with a generally vertical end wall 20. The receptacle 12 formed by the base 16, the two opposed side walls 18, and the two opposed end walls 20 is dimensioned and configured, in the preferred embodiment, to receive and enclose a typical small outline IC device 22 (FIG. 3).

Extending inwardly from the interior surface of at least one side wall 18 is a row of guide elements 24, each of which extends partway up the side wall 18 from the base 16. The guide elements 24 are spaced apart to define slots 26 between adjacent ones of the guide elements. Advantageously, the guide elements 24 have tapered tips 28, so that the slots 26 are wider at their tops than at their bottoms.

Disposed at the bottom of each slot 26 is an electrical contact 30. As best shown in FIG. 6, each of the contacts 30 is of a multi-wire type, comprising a pair of elongate wire loops 31a and 31b of two different lengths, and arranged in overlapping relationship so that each loop has one leg interposed between the legs of the other loop. The closed ends of the loops 31a and 31b are thus "staggered", to present adjacent wire elements or legs of alternating lengths. Each leg of each of the loops 31a and 31b is advantageously provided with an upwardly extending hump 32 near the closed end thereof.

The contacts 30 are each conductively attached to an interior tab portion 33 of a socket pin 34, each of the latter having a shank 36 which extends through the base 16 of the receptacle. The tab portion 33 is preferably bent downwardly so as to form a slightly acute angle (e.g., approximately 80 degrees) with the shank 36 of the pin 34. The portion of each contact 30 that includes the closed ends of each of the wire loops 31a and 31b, as well as the humps 32, extends away from the interior tab portion 33 of the associated pin 34 to provide a cantilevered, resiliently flexible free end for each of the contacts 30, the advantage of which will be made apparent below. With the aforementioned "staggering" of the wire loops 31a and 31b, it can be seen that the closed end of one loop extends away from the tab 33 farther than does the closed end of the other loop.

As shown in FIG. 5, the shank 36 of each pin 34 is provided with barbs 40 which engage the base 16 around the holes 42 in the base through which the pin shanks 36 pass. The barbs 40 lock the pins 34 in place and restrain them from being vertically displaced when the socket is being handled, used, or assembled. The barbs 40 also minimize any loosening of the pins 34 through repeated use of the socket, or through forming of the pins in a surface-mount configuration after the socket is assembled.

The cover element 14 is preferably provided with heat dissipation vents 43, and it has an exterior perimeter conforming to the interior shape and size of the receptacle 12. Thus, when the cover 14 is placed on the receptacle, its sides fit flush against the interior surfaces of the side walls 18. Extending downwardly from the bottom surface of the cover element 14, along each of its longer sides, is a row of elongate prongs or "fingers" 44. The fingers 44 are registrable with, and receivable in, the slots 26. The socket assembly of the present invention can be made with only a single row of guide elements 24 and interspersed slots 26 and contacts 30, and with only a single row of fingers 44 on the cover 14 to accommodate IC devices having leads on only one side. The preferred embodiment, however, has a row of the appropriate elements on each of the longer sides of the receptacle 12 and cover 14, in order to accommodate IC devices, such as small outline devices, which have leads on two opposed sides. It should be noted from FIGS. 2 and 3 that the drawings illustrate the preferred embodiment, even though FIG. 1 is taken from a perspective that shows only a single row of guide elements 24.

Referring now to FIGS. 3 and 4, the operation of the socket will now be readily understood. With the cover 14 removed, an IC device 22 is placed in the receptacle 12. The device 22, if it is the small outline (SO) type, has a plurality of generally step-shaped leads 46 extending from each side of its body, each ending a short horizontal tab 48. The tabs 48 register with, and are received in, the slots 26, one tab to a slot, with the tabs engaging the contacts 30 near the bottoms of the slots. The cover 14 is then installed on the receptacle 12, with the fingers 44 being received in the slots 26, as described above. As best seen in FIG. 4, the fingers 44 engage the tabs 48, urging them into intimate contact with the cantilevered free ends of the electrical contacts 30. The engagement of the tabs 48 by the fingers 44 tends to push the contacts downwardly, while the previously-mentioned resilient flexibility of the contacts' free ends biases them upwardly against the tabs 48, thereby assuring that a positive, low resistance electrical connection is maintained between the leads 46 and the contacts 30. This coaction of the fingers 44 and the cantilevered contacts 30 also allows good electrical contact to be maintained with all of the leads 46, even if their end tabs 48 are not exactly coplanar. The use of multi-wire contacts is advantageous because of their durability and their ability to withstand repeated flexing due to insertion and removal of IC devices without acquiring a "set". Moreover, the use of the overlapping loops 31a and 31b to form each of the contacts 30 assures that good electrical contact is maintained at a number of points on each device lead 46, and provides a strong, box-like spring configuration that resists lateral movement ("splaying") of the wire elements of the contacts as a result of their engagement with the leads. Also, by using looped wire elements, the total effective resistance of the lead/contact interface is somewhat lowered, as compared to unlooped, straight wire elements.

The positive locking action provided by the fingers 44 of the cover also provides good mechanical durability, allowing the device to be retained in the socket with positive electrical contact maintained even if the socket is subjected to vibrations and physical shocks. Furthermore, the electrical and mechanical characteristics of the socket are maintained despite extended periods of repeated use.

The positive locking action of the cover 14 is advantageously enhanced by several specific features. For example, as shown in FIGS. 2 and 3, the inside surface of the cover is preferably provided with a recess 50 conforming to the perimeter of the body of the IC device 22. Also, as shown in FIG. 1, the ends of the cover 14 are each provided with a thinned edge or flange 52 (only one of which is shown in the drawing). The flanges 52 are engaged by inwardly-extending retention members or prongs 54 provided at the tops of the receptacle end walls 20, and this engagement between the flanges 52 and the prongs 54 positively locks the cover 14 in place. The prongs 54 are advantageously provided with sloped inner faces 56 to facilitate the insertion and removal of the cover 14.

Removal of the IC device from the socket is facilitated by the provision of a pair of vertical slots 58 in the end walls 20, on either side of the prongs 54. The slots 58 allow the end walls 20 to be bent slightly outwardly to disengage the prongs 54 from the cover flanges 52, thereby allowing the cover 14 to be easily removed. The slots 58 can also provide access for a suitable tool (not shown) which may be used to remove the device.

From the foregoing description, it can be appreciated that the present invention provides an IC socket that is particularly adapted to accommodate SO devices, and which provides good physical retention of the device, while maintaining good electrical contact and thus low contact resistance. The socket is durable in its ability to maintain good physical retention and integrity of electrical contact in the face of long-term repeated use, as well as adverse physical conditions (e.g., vibration and shocks). The present invention provides these advantages with a structure that is easily and economically manufactured and which is easily used, lacking, as it does, any complex and costly moving parts (except for the removable cover). The present invention can also be made in a size that is not substantially bigger than a typical SO device, a feature which is highly advantageous in certain applications.

As previously mentioned, the socket pins 36 can be formed into a surface mount configuration after assembly of the socket. This can be done by bending the exterior (distal) ends of the pins outwardly to form horizontal tabs or "feet". If desired, these surface-mounting tabs can be configured to give the socket essentially the same "footprint" as the device contained in it, so that the socket and the device can use the same circuit board pads, if it is later desired to surface mount the IC device directly.

While a preferred embodiment of the invention has been described herein, it should be noted that many modifications may suggest themselves to those skilled in the pertinent arts. For example, the receptacle 12 and cover 14 may be made square, instead of rectangular, and may be provided with guide members 24, slots 26, contacts 30, and fingers 44 on all four sides to accommodate IC devices with leads on all four sides. Furthermore, the receptacle and cover can be configured to accommodate IC devices with any number of leads on a side. In addition, the cover may be removable by any of a variety of means. For example, it may be attached at one end or side to the receptacle 12 by a hinge or the like. Other modifications may be made, for example, in the configuration of the contacts 30, to accommodate IC devices having a variety of lead shapes and sizes. For example, the angle of the tabs 33 on the pins 36 can be varied to provide more or less cantilever action, and the number of wire loops forming each contact can be increased to three or more, if desired, to accommodate larger IC packages. These and other modifications should be considered within the spirit and scope of the invention, as defined in the claims which follow.

What is claimed is:

1. A socket for an integrated circuit device having a body with leads extending from at least one side thereof, said socket comprising:
   a receptacle including a base and a pair of substantially vertical side walls extending upwardly from opposite sides of said base, said receptacle being dimensioned to receive said device;
   means forming a row of spaced-apart vertical slots extending upwardly from said base adjacent the interior surface of at least one of said side walls, said slots being dimensioned and spaced so that each of said leads is received separately in one of said slots when said device is received in said receptacle, said slot forming means comprising a row of substantially vertical guide members extending inwardly from said interior side wall surface and upwardly from said base at least partway up said side wall, said slots being defined between adjacent ones of said guide members;
   an electrical contact in each of said slots; and
   a cover for said receptacle having a plurality of fingers extending downwardly therefrom, each of said fingers being registrable with, and receivable in, one of said slots;
   whereby when said device is received in said receptacle with its leads each received in one of said slots, and said cover is placed on said receptacle with its fingers each received in one of said slots, each of said leads is engaged between one of said fingers and one of said contacts in one of said slots.

2. A socket for an integrated circuit device having a body with leads extending from at least one side thereof, said socket comprising:
   a receptacle including a base and a pair of substantially vertical side walls extending upwardly from opposite sides of said base, said receptacle being dimensioned to receive said device;
   means forming a row of spaced-apart vertical slots extending upwardly from said base adjacent the interior surface of at least one of said side walls, said slots being dimensioned and spaced so that each of said leads is received separately in one of said slots when said device is received in said receptacle;
   a conductive pin extending from the bottom of each of said slots through said base, each of said pins having an interior portion within its associated slot;
   a multi-wire electrical contact in each of said slots, each of said contacts being conductively connected to the interior portion of one of said pins; and
   a cover for said receptacle having a plurality of fingers extending downwardly therefrom, each of said fingers being registrable with, and receivable in, one of said slots;
   wherein when said device is received in said receptacle with its leads each received in one of said slots, and said cover is placed on said receptacle with its fingers each received in one of said slots, each of said leads is engaged between one of said fingers and one of said contacts in one of said slots.

3. The socket of claim 1, wherein each of said contacts is a multi-wire contact located adjacent the bottom of its associated slot.

4. The socket of claim 1, further comprising a conductive pin extending from the bottom of each of said slots through said base, each of said pins being conductively connected to one of said contacts.

5. The socket of claim 4, wherein each of said pins extends through a hole in said base and includes holding means for restraining vertical movement of said pin through said hole.

6. The socket of claim 5, wherein said holding means includes a barb on said pin engageable with said base around said hole.

7. The socket of claim 4, wherein each of said pins has an interior portion within its associated slot, and wherein each of said contacts is a multi-wire contact conductively attached to said interior portion.

8. The socket of claim 1, wherein said slot-forming means are provided along the interior surfaces of both of said side walls.

9. The socket of claim 1, wherein said base is substantially rectangular, with said side walls extending upwardly from two opposed sides thereof, and wherein said receptacle further includes an end wall extending generally vertically from each of the two remaining opposed sides of the base, and wherein said socket further comprises locking means co-engageable between said cover and said end walls.

10. The socket of claim 9, wherein said locking means comprises:
    a flange on said cover on each of the ends thereof which is positionable against said end walls;
    a prong on each of said end walls engageable with one of said flanges; and
    means operably associated with at least one of said end walls for permitting said one of said end walls to be bent to disengage the prong on said one of said end walls from the adjacent flange.

11. The socket of claim 10, wherein said means operatively associated with at least one of said end walls comprises a pair of substantially vertical slots on either side of said prong.

12. A socket for an integrated circuit device having a body with leads extending from two opposed sides thereof, said socket comprising:
    a receptacle having a substantially rectangular base and a pair of side walls extending upwardly from opposite sides of said base, said receptacle being dimensioned to receive said device;
    a plurality of spaced-apart guide members extending inwardly from the interior surface of each of said side walls, said guide members being spaced so as to define a row of slots along the interior surface of each of said side walls, said slots being spaced and dimensioned so that each lead of said device is separately receivable in one of said slots;
    an electrical contact in each of said slots;
    a conductive pin extending from the bottom of each of said slots through said base, each of said pins being conductively connected to one of said contacts; and
    a substantially rectangular cover for said receptacle having a row of spaced-apart fingers extending downwardly from each of two opposed sides thereof, each of said fingers being registrable with, and receivable in, one of said slots;
    whereby, when said device is received in said receptacle with each of its leads being received in one of said slots, and said cover is placed on said receptacle with each of its fingers received in one of said slots, each of said leads is thereby engaged between one of said fingers and one of said contacts in one of said slots.

13. The socket of claim 12, wherein each of said contacts is a multi-wire contact located at or near the bottom of its associated slot.

14. The socket of claim 12, wherein each of said pins includes a shank portion extending through said base, and a barb on said shank portion engaging said base adjacent said shank portion.

15. The socket of claim 12, wherein each of said pins has an interior portion within its associated slot, and wherein each of said multi-wire contacts has a first end conductively connected to said interior portion and second end unconnected to said interior portion so as to be resiliently flexible.

16. The socket of claim 12, wherein said receptacle further includes an end wall extending generally upwardly from each of the two remaining opposed sides of said base, said socket further comprising locking means for selectively engaging and disengaging said cover and said end walls.

17. The socket of claim 16, wherein said locking means comprises:
    an edge portion on each of two opposed ends of said cover, each of said edge portions being positionable adjacent one of said end walls;
    first means on each of said end walls and selectively engageable with an adjacent one of said edge portions; and
    second means, operably associated with at least one of said end walls, for permitting said one of said end walls to be selectively bent to disengage said first means from said edge portions.

18. The socket of claim 17, wherein said first means includes a prong on each of said end walls, said prong being selectively engageable with said adjacent one of said edge portions, and wherein said second means includes a pair of substantially vertical slots on either side of said prong.

19. A socket for an integrated circuit device having a rectangular body with leads extending from each of two opposed sides thereof, said socket comprising:
    a receptacle dimensioned and configured to receive said device, said receptacle including a generally rectangular base and a side wall extending substantially upwardly from each of two opposed sides of said base;
    a row of spaced-apart, generally vertical guide elements extending inwardly from the interior surface of each of said side walls, each of said rows of guide elements defining a row of spaced-apart, generally vertical slots along the interior surface of one of said side walls, said slots being spaced and dimensioned so that each lead of said device is individually receivable in one of said slots;
    a conductive pin extending from the bottom of each of said slots through said base, each of said pins having an interior portion within its associated slot;
    an electrical contact in each of said slots, each of said contacts having a first end conductively connected to said interior portion of one of said pins, and a second end unconnected to said pin so as to be resiliently flexible; and a substantially rectangular cover for said receptacle having a row of spaced-apart fingers extending downwardly from each of two opposed sides thereof, each of said fingers being registrable with, and receivable in, one of said slots;

whereby, when said device is received in said receptacle with each of its leads received in one of said slots, and said cover is placed on said receptacle with each of said fingers received in one of said slots, each of said leads is thereby engaged between one of said fingers and one of said contacts in one of said slots.

20. The socket of claim 19, wherein each of said contacts is a multi-wire contact.

21. The socket of claim 19, wherein each of said pins includes a shank portion extending through said base, and a barb on said shank portion engaging said base adjacent said shank portion.

22. The socket of claim 19, wherein said receptacle further includes an end wall extending generally upwardly from each of the two remaining opposed sides of said base, said socket further comprising locking means for selectively engaging and disengaging said cover and said end walls.

23. The socket of claim 22, wherein said locking means comprises:
an edge portion on each of two opposed ends of said cover, each of said edge portions being positionable adjacent one of said end walls;
first means on each of said end walls and selectively engageable with an adjacent one of said edge portions; and
second means, operably associated with at least one of said end walls, for permitting said one of said end walls to be selectively bent to disengage said first means from said edge portions.

24. The socket of claim 23, wherein said first means includes a prong on each of said end walls, said prong being selectively engageable with said adjacent of said edge portions, and wherein said second means includes a pair of substantially vertical slots on either side of said prong.

25. The socket of claim 20, wherein each of said contacts comprises:
a first elongate wire loop having a closed end and a pair of legs extending from said closed end; and
a second elongate wire loop having a closed end and a pair of legs extending from said closed end;
one of the legs of said first wire loop being interposed between the legs of said second wire loop, and one of the legs of said second wire loop being interposed between the legs of said first wire loop;
said second end of said contact including the closed ends of said first and second wire loops.

26. The socket of claim 25, wherein each of said first and second wire loops includes a humped portion adjacent the closed end thereof, and wherein the closed end of said first wire loop extends farther from said interior portion of said pin than does the closed end of said second wire loop.

27. An electrical contact assembly, comprising:
a conductive pin having a shank portion and a tab portion bent at an angle to said shank portion; and
an electrical contact having a first end conductively connected to said tab portion and a second end unconnected to said tab portion so as to be resiliently flexible;
said contact comprising first and second elongate wire loops each having a closed end and a pair of legs extending from said closed end, one of the legs of said first wire loop being interposed between the legs of said second wire loop, and one of the legs of said second wire loop being interposed between the legs of said first wire loop;
said second end of said contact including the closed ends of said first and second wire loops.

28. The electrical contact assembly of claim 27, wherein each of said first and second wire loops includes a humped portion adjacent the closed end thereof, and wherein the closed end of said first wire loop extends farther from said tab portion than does the closed end of said second wire loop.

* * * * *

UNITED STATES PATENT OFFICE
CERTIFICATE OF CORRECTION

Patent No. 4,583,806　　　　　　　　　Dated April 22, 1986

Inventor(s) Leland B. Tainter, et al.

It is certified that error appears in the above-identified patent and that said Letters Patent are hereby corrected as shown below:

| Column | Line | Error |
| --- | --- | --- |
| 2 | 45 | "sockets" should read --socket-- |
| 4 | 21 | "wbich" should read --which-- |
| 6 | 65 | "wherein" should read --whereby-- |
| 9 | 42 | "adjacent of" should read --adjacent one of-- |

Signed and Sealed this

Fourteenth Day of October, 1986

[SEAL]

*Attest:*

DONALD J. QUIGG

*Attesting Officer*　　　*Commissioner of Patents and Trademarks*